(12) United States Patent
Lee et al.

(10) Patent No.: US 11,742,837 B2
(45) Date of Patent: Aug. 29, 2023

(54) VOLTAGE CONTROLLED OSCILLATOR AND CONTROL METHOD THEREOF, P2P INTERFACE CIRCUIT, ELECTRONIC DEVICE

(71) Applicants: Beijing ESWIN Computing Technology Co., Ltd., Beijing (CN); Hefei ESWIN IC Technology Co., Ltd., Hefei (CN)

(72) Inventors: Dongmyung Lee, Beijing (CN); Donghoon Baek, Beijing (CN); Jangjin Nam, Beijing (CN)

(73) Assignees: Beijing ESWIN Computing Technology Co., Ltd., Beijing (CN); Hefei ESWIN IC Technology Co., Ltd., Hefei (CN)

( * ) Notice: Subject to any disclaimer, the term of this patent is extended or adjusted under 35 U.S.C. 154(b) by 95 days.

(21) Appl. No.: 17/421,688

(22) PCT Filed: May 13, 2021

(86) PCT No.: PCT/CN2021/093603
§ 371 (c)(1),
(2) Date: Jul. 8, 2021

(87) PCT Pub. No.: WO2022/095404
PCT Pub. Date: May 12, 2022

(65) Prior Publication Data
US 2022/0376683 A1     Nov. 24, 2022

(30) Foreign Application Priority Data
Nov. 5, 2020   (CN) .......................... 202011225732.2

(51) Int. Cl.
*H03K 3/03* (2006.01)
*H03L 7/099* (2006.01)
*H03K 5/00* (2006.01)

(52) U.S. Cl.
CPC ......... *H03K 3/0322* (2013.01); *H03L 7/0995* (2013.01); *H03K 5/00* (2013.01)

(58) Field of Classification Search
CPC .............. H03K 3/0322; H03K 3/0315; H03K 2005/00208; H03K 2005/00078;
(Continued)

(56) References Cited

U.S. PATENT DOCUMENTS 6,160,457 A * 12/2000 Wu ........................ H03B 5/364
331/158
7,102,449 B1 * 9/2006 Mohan ................. H03K 3/0322
327/57

(Continued)

FOREIGN PATENT DOCUMENTS

CN      101192828 A     6/2008
CN      103326715 A     9/2013
(Continued)

OTHER PUBLICATIONS

Written Opinion of the International Search Authority corresponding to International Application No. PCT/CN2021/093603, dated Aug. 6, 2021 (10 pages).
(Continued)

*Primary Examiner* — Ryan Johnson
(74) *Attorney, Agent, or Firm* — Maginot, Moore & Beck LLP

(57) ABSTRACT

This disclosure provides a voltage controlled oscillator and a control method thereof, a P2P interface circuit, an electronic device, and relates to the field of voltage controlled oscillation technology. The voltage controlled oscillator
(Continued)

includes N stages of delay units, and the delay unit of each stage includes: a first inverter, a second inverter, a third inverter, and a fourth inverter; both the second inverter and the third inverter are electrically connected to a frequency control terminal, and whether to activate the second inverter and the third inverter is controlled by the frequency control terminal.

9 Claims, 11 Drawing Sheets

(58) Field of Classification Search
CPC . H03K 2005/00234; H03K 2005/0015; H03K 2005/00195; H03K 2005/00228; H03K 19/0002; H03K 19/20; H03L 7/0995
See application file for complete search history.

(56) References Cited

U.S. PATENT DOCUMENTS

| | | | |
|---|---|---|---|
| 7,663,446 B1 | 2/2010 | Surin | |
| 2004/0070459 A1* | 4/2004 | Motoyama | H03K 3/0315 331/57 |
| 2011/0241791 A1* | 10/2011 | Hung | H03B 5/36 331/158 |
| 2015/0097629 A1* | 4/2015 | Chong | H03K 3/0322 331/57 |
| 2020/0321915 A1* | 10/2020 | Tajalli | H03B 5/24 |

FOREIGN PATENT DOCUMENTS

| | | |
|---|---|---|
| CN | 104242927 A | 12/2014 |
| CN | 104270147 A | 1/2015 |
| CN | 104300972 A | 1/2015 |
| CN | 104821825 A | 8/2015 |
| CN | 112332839 A | 2/2021 |

OTHER PUBLICATIONS

Machine Translation of Written Opinion of the International Search Authority corresponding to International Application No. PCT/CN2021/093603, dated Aug. 6, 2021 (3 pages).

* cited by examiner

VOLTAGE CONTROLLED OSCILLATOR AND CONTROL METHOD THEREOF, P2P INTERFACE CIRCUIT, ELECTRONIC DEVICE

CROSS-REFERENCE TO RELATED APPLICATION

The present application is a U.S. national phase application of PCT Application No. PCT/CN2021//093603, filed May 13, 2021, which claims priority of Chinese patent application No. 202011225732.2, filed in China on Nov. 5, 2020, the disclosures of which are hereby incorporated by reference in there entireties.

TECHNICAL FIELD

The present disclosure relates to the field of voltage controlled oscillation technology, and in particular to a voltage controlled oscillator and a control method thereof, a P2P interface circuit, and an electronic device.

BACKGROUND

In the field of display driver integrated circuit (DDI), due to increase in display resolution and frame rate, a point-to-point (P2P) interface technology capable of high-speed data transmission is widely used. A P2P interface circuit includes a circuit that recovers clock and data from a transmitted signal, and one of core elements of the circuit is a voltage-controlled oscillator capable of generating a signal of required frequency in the DDI system.

In most DDI systems, a ring voltage controlled oscillator (ring VCO) is generally used. For ring VCOs in the related art, in order to enable a wider operating frequency range, the power supply voltage of the ring oscillator has to be extremely reduced when generating a low-frequency clock signal. However, due to the existence of swing level, the VCOs are susceptible to power supply voltage noise such as ground bounce. In addition, as rising/falling time of the clock signal become greater, a phase mismatch of a multi-phase clock increases, resulting in that a clock signal jitter caused by the phase noise also becomes larger.

Therefore, there is an urgent need for a new type of voltage-controlled oscillator that can achieve a wider operating frequency range while reducing power supply voltage noise and ensuring that the clock signal has excellent characteristics.

SUMMARY

The present disclosure aims to provide a voltage-controlled oscillator and a control method thereof, a P2P interface circuit, and an electronic device for achieving a wider operating frequency range while reducing power supply voltage noise and ensuring that the clock signal has excellent characteristics.

In order to achieve the above object, the present disclosure provides technical solutions as follows.

A first aspect of the present disclosure provides a voltage-controlled oscillator, including:

N stages of delay units, a first output terminal of the delay unit of an X-th stage is electrically connected to a first input terminal of the delay unit of an (X+1)-th stage, and a second output terminal of the delay unit of the X-th stage is electrically connected to a fourth input terminal of the delay unit of the (X+1)-th stage; a second input terminal of the delay unit of the (X+1)-th stage and a fourth input terminal of the delay unit of the X-th stage are connected to a same signal, and a third input terminal of the delay unit of the (X+1)-th stage and a first input terminal of the delay unit of the X-th stage are connected to a same signal; a first input terminal of the delay unit of a first stage is electrically connected to a first output terminal of the delay unit of a N-th stage, a second input terminal of the delay unit of the first stage and a fourth input terminal of the delay unit of the N-th stage are connected to a same signal, a third input terminal of the delay unit of the first stage and a first input terminal of the delay unit of the N-th stage are connected to the same signal, and a fourth input terminal of the delay unit of the first stage is electrically connected to a second output terminal of the delay unit of the N-th stage; wherein N is an integer, $1 \leq X \leq N-1$;

a delay unit of each stage includes: a first inverter, a second inverter, a third inverter, and a fourth inverter; an input terminal of the first inverter is a first input terminal of the delay unit to which the first inverter belongs, an input terminal of the second inverter is a second input terminal of the delay unit to which the second inverter belongs, and an input terminal of the third inverter is a third input terminal of the delay unit to which the third inverter belongs, an input terminal of the fourth inverter is a fourth input terminal of the delay unit to which the fourth inverter belongs; an output terminal of the first inverter and an output terminal of the second inverter are both electrically connected to a first output terminal of the delay unit to which the first inverter and the second inverter belong, and an output terminal of the third inverter and an output terminal of the fourth inverter are both electrically connected to a second output terminal of the delay unit to which the third inverter and the fourth inverter belong;

both the second inverter and the third inverter are electrically connected to a frequency control terminal, and whether to activate the second inverter and the third inverter is controlled by the frequency control terminal.

Optionally, the second inverter and/or the third inverter includes: a first control unit, a second control unit, a third control unit, and a fourth control unit; the frequency control terminal includes a first frequency control terminal and a second frequency control terminal, wherein the first frequency control terminal outputs a signal opposite in phase to a signal outputted by the second frequency control terminal;

the first control unit is electrically connected to the first frequency control terminal, a first level signal input terminal, an input signal terminal, and a control terminal of the second control unit, respectively, and is configured to, under control of the first frequency control terminal, turn on or turn off a connection between the first level signal input terminal and the control terminal of the second control unit, and turn on or turn off a connection between the input signal terminal and the control terminal of the second control unit;

the second control unit is also electrically connected to the first level signal input terminal and an output terminal of an inverter to which the second control unit belongs, respectively, and is configured to turn on or turn off a connection between the first level signal input terminal and the output terminal under control of a control terminal included in the second control unit;

the third control unit is electrically connected to the second frequency control terminal, a second level signal input terminal, an input signal terminal, and a control terminal of the fourth control unit, respectively, and is configured to, under control of the second frequency control terminal, turn on or turn off a connection between the second level signal input terminal and the control terminal of the fourth control unit, and turn on or turn off a connection between the input signal terminal and the control terminal of the fourth control unit;

the fourth control unit is also electrically connected to the second level signal input terminal and an output terminal of an inverter to which the fourth control unit belongs, respectively, and is configured to turn on or turn off a connection between the second level signal input terminal and the output terminal under control of a control terminal included in the fourth control unit;

the input signal terminal is a second input terminal or a third input terminal.

Optionally, the first control unit includes a first transistor and a second transistor, the second control unit includes a third transistor, the third control unit includes a fourth transistor and a fifth transistor, and the fourth control unit includes a sixth transistor;

a gate electrode of the first transistor and a gate electrode of the second transistor are both electrically connected to the first frequency control terminal, and a first electrode of the first transistor is electrically connected to the first level signal input terminal, a second electrode of the first transistor and a second electrode of the second transistor are both electrically connected to a gate electrode of the third transistor, and a first electrode of the second transistor is electrically connected to the input signal terminal;

a first electrode of the third transistor is electrically connected to the first level signal input terminal, and a second electrode of the third transistor is electrically connected to an output terminal of an inverter to which the third transistor belongs;

a gate electrode of the fourth transistor and a gate electrode of the fifth transistor are both electrically connected to the second frequency control terminal, a first electrode of the fourth transistor is electrically connected to the input signal terminal, a second electrode of the four transistor and a second electrode of the fifth transistor are both electrically connected to a gate electrode of the sixth transistor, and a first electrode of the fifth transistor is electrically connected to the second level signal input terminal;

a first electrode of the sixth transistor is electrically connected to the second level signal input terminal, and a second electrode of the sixth transistor is electrically connected to an output terminal of an inverter to which the sixth transistor belongs.

Optionally, the second inverter and/or the third inverter includes: a fifth control unit, a sixth control unit, a seventh control unit, and an eighth control unit; the frequency control terminal includes a first frequency control terminal and a second frequency control terminal, wherein the first frequency control terminal outputs a signal opposite in phase to a signal outputted by the second frequency control terminal;

the fifth control unit is electrically connected to the input signal terminal, the first level signal input terminal, and an input terminal of the sixth control unit, respectively, and is configured to, under control of the input signal terminal, turn on or turn off a connection between the first level signal input terminal and the input terminal of the sixth control unit;

the sixth control unit is also electrically connected to the second frequency control terminal and an output terminal of an inverter to which the sixth control unit belongs, respectively, and is configured to, under control of the second frequency control terminal, turn on or turn off an electrical connection between the input terminal included in the sixth control unit and the output terminal;

the seventh control unit is electrically connected to the first frequency control terminal, an output terminal of an inverter to which the seventh control unit belongs, and an output terminal of the eighth control unit, respectively, and is configured to turn on or turn off a connection between the output terminal of the inverter to which the seventh control unit belongs and the output terminal of the eighth control unit under control of the first frequency control terminal;

the eighth control unit is also connected to the input signal terminal and the second level signal input terminal respectively, and is configured to turn on or turn off a connection between the second level signal input terminal and the output terminal of the eighth control unit under control of the input signal terminal;

the input signal terminal is a second input terminal or a third input terminal.

Optionally, the fifth control unit includes a seventh transistor, the sixth control unit includes an eighth transistor, the seventh control unit includes a ninth transistor, and the eighth control unit includes a tenth transistor;

a gate electrode of the seventh transistor is electrically connected to the input signal terminal, a first electrode of the seventh transistor is electrically connected to the first level signal input terminal, and a second electrode of the seventh transistor is electrically connected to a first electrode of the eighth transistor;

a gate electrode of the eighth transistor is electrically connected to the second frequency control terminal, and a second electrode of the eighth transistor is electrically connected to an output terminal of an inverter to which the eighth transistor belongs;

a gate electrode of the ninth transistor is connected to the first frequency control terminal, a first electrode of the ninth transistor is connected to a second electrode of the tenth transistor, and a second electrode of the ninth transistor is electrically connected to an output terminal of an inverter to which the ninth transistor belongs;

a gate electrode of the tenth transistor is connected to the input signal terminal, and a first electrode of the tenth transistor is connected to the second level signal input terminal.

Optionally, the delay unit of each stage further includes: a fifth inverter and a sixth inverter;

an input terminal of the fifth inverter is electrically connected to a first output terminal of the delay unit to which the fifth inverter belongs, and an output terminal of the fifth inverter is electrically connected to a second output terminal of the delay unit to which the fifth inverter belongs;

an input terminal of the sixth inverter is electrically connected to a second output terminal of the delay unit to which the sixth inverter belongs, and an output terminal of the sixth inverter is electrically connected to a first output terminal of the delay unit to which the sixth inverter belongs.

Optionally, the voltage controlled oscillator further includes:

a frequency comparison module, configured to compare an input data frequency with a preset reference frequency to determine a level of a frequency control signal outputted by the frequency control terminal, so as to control whether to activate the second inverter and the third inverter.

Based on the above-mentioned voltage-controlled oscillator technical solution, a second aspect of the present disclosure provides a P2P interface circuit including the above-mentioned voltage-controlled oscillator.

Based on the above-mentioned technical solution of the P2P interface circuit, a third aspect of the present disclosure provides an electronic device including the above-mentioned P2P interface circuit.

Based on the above-mentioned voltage-controlled oscillator technical solution, a fourth aspect of the present disclosure provides a voltage-controlled oscillator control method, applied to the above-mentioned voltage-controlled oscillator, and the control method includes:

controlling whether to activate the second inverter and the third inverter under control of the frequency control terminal.

Optionally, the voltage controlled oscillator further includes a frequency comparison module;

the controlling whether to activate the second inverter and the third inverter under the control of the frequency control terminal specifically includes:

comparing, through the frequency comparison module, an input data frequency with a preset reference frequency, activating the second inverter and the third inverter when the input data frequency is greater than the preset reference frequency, and not activating the second inverter and the third inverter when the input data frequency is less than the preset reference frequency.

In the technical solutions provided by the present disclosure, when the required signal frequency is high, the second inverter and the third inverter in the delay unit can be activated, and when the required signal frequency is low, the second inverter and the third inverter in the delay unit may be not activated; therefore, the technical solutions provided by the present disclosure can selectively, according to actual needs, control whether to activate a feedforward path, which not only expands the signal frequency range that can be generated, reduces the power supply voltage noise, but also realizes the generation of a clock signal with large swing level, small rising/falling time, and excellent multi-phase clock phase mismatch and phase noise characteristics.

BRIEF DESCRIPTION OF THE DRAWINGS

The drawings described herein are used to provide a further understanding of the present disclosure and constitute a part of the present disclosure. The exemplary embodiments of the present disclosure and their descriptions are used to explain the present disclosure, and do not constitute an undue limitation of the present disclosure. In the drawings.

DETAILED DESCRIPTION

In order to further illustrate the voltage controlled oscillator and the control method thereof, the P2P interface circuit, and the electronic device provided by embodiments of the present disclosure, detailed description is given in connection with the drawings below.

Figure 1:
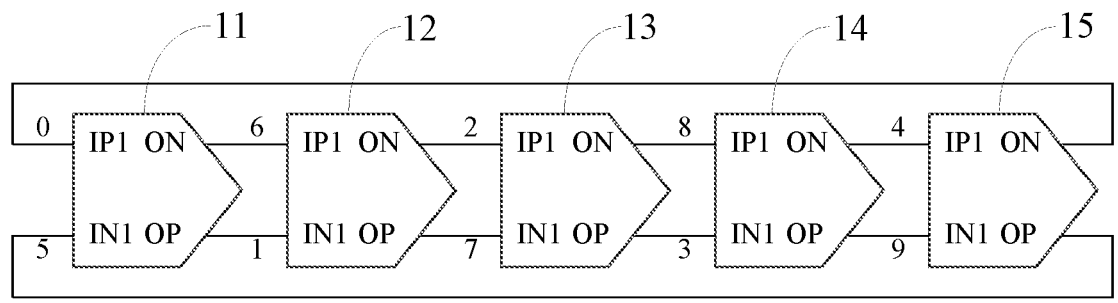
FIG. 1 is a schematic structural diagram of a first ring voltage-controlled oscillator provided by the present disclosure.

As shown in FIG. 1, the present disclosure provides a first ring voltage-controlled oscillator. The ring voltage-controlled oscillator includes five stages of differential inverting amplifiers, and the specific structure of each stage of differential inverting amplifier is as shown in FIG. 2.

In this ring voltage-controlled oscillator, a first output terminal ON of a first-stage differential inverting amplifier 11 is electrically connected to a first input terminal IP1 of a second-stage differential inverting amplifier 12, and a second output terminal OP of the first-stage differential inverting amplifier 11 is electrically connected to a second input terminal IN1 of the second-stage differential inverting amplifier 12, a first output terminal ON of the second-stage differential inverting amplifier 12 is electrically connected to a first input terminal IP1 of a third-stage differential inverting amplifier 13, a second output terminal OP of the second-stage differential inverting amplifier 12 is electrically connected to a second input terminal IN1 of the third-stage differential inverting amplifier 13, a first output terminal ON of the third-stage differential inverting amplifier 13 is electrically connected to a first input terminal IP1 of a fourth-stage differential inverting amplifier 14, a second output terminal OP of the third-stage differential inverting amplifier 13 is electrically connected to a second input terminal IN1 of the fourth-stage differential inverting amplifier 14, a first output terminal ON of the fourth-stage differential inverting amplifier 14 is electrically connected to a first input terminal IP1 of a fifth-stage differential inverting amplifier 15; a second output terminal OP of the fourth-stage differential inverting amplifier 14 is electrically connected to a second input terminal IN1 of the fifth-stage differential inverting amplifier 15, a first output terminal ON of the fifth-stage differential inverting amplifier 15 is electrically connected to a first input terminal IP1 of the first-stage differential inverting amplifier 11, a second output terminal OP of the fifth-stage differential inverting amplifier 15 is electrically connected to a second input terminal IN1 of the first-stage differential inverting amplifier 11.

Figure 2:
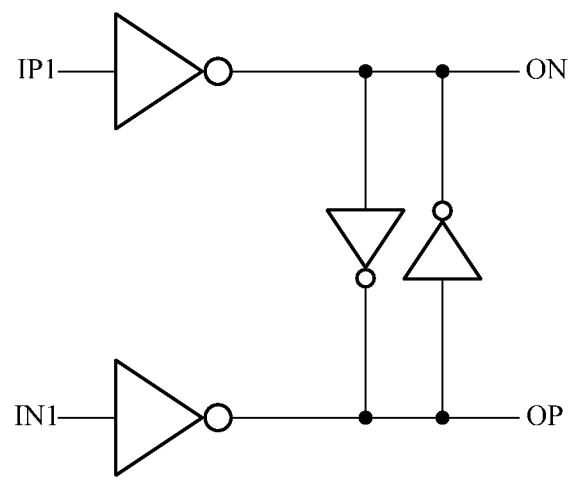
FIG. 2 is a schematic structural diagram of each stage of differential inverting amplifier in FIG. 1.

As shown in FIG. 2, each stage of differential inverting amplifier includes four inverters, wherein an input terminal of one inverter is used as the first input terminal IP1, and an output terminal of the inverter is used as the first output terminal ON; an input terminal of another inverter is used as the second input terminal IN1, and an output terminal of the another inverter is used as the second output terminal OP; the remaining two inverters are connected in an opposite manner between the first output terminal ON and the second output terminal OP.

Figure 3:
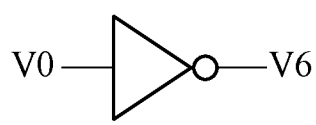
FIG. 3 is a schematic structural diagram of an inverter provided by the present disclosure.
Figure 4:
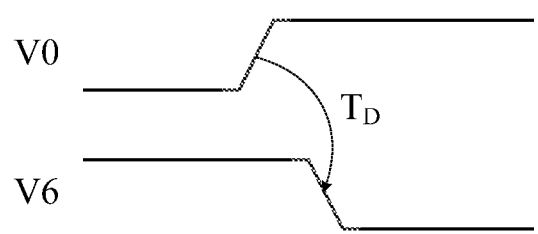
FIG. 4 is a schematic diagram of input to output delay of the inverter in FIG. 3.
Figure 5:
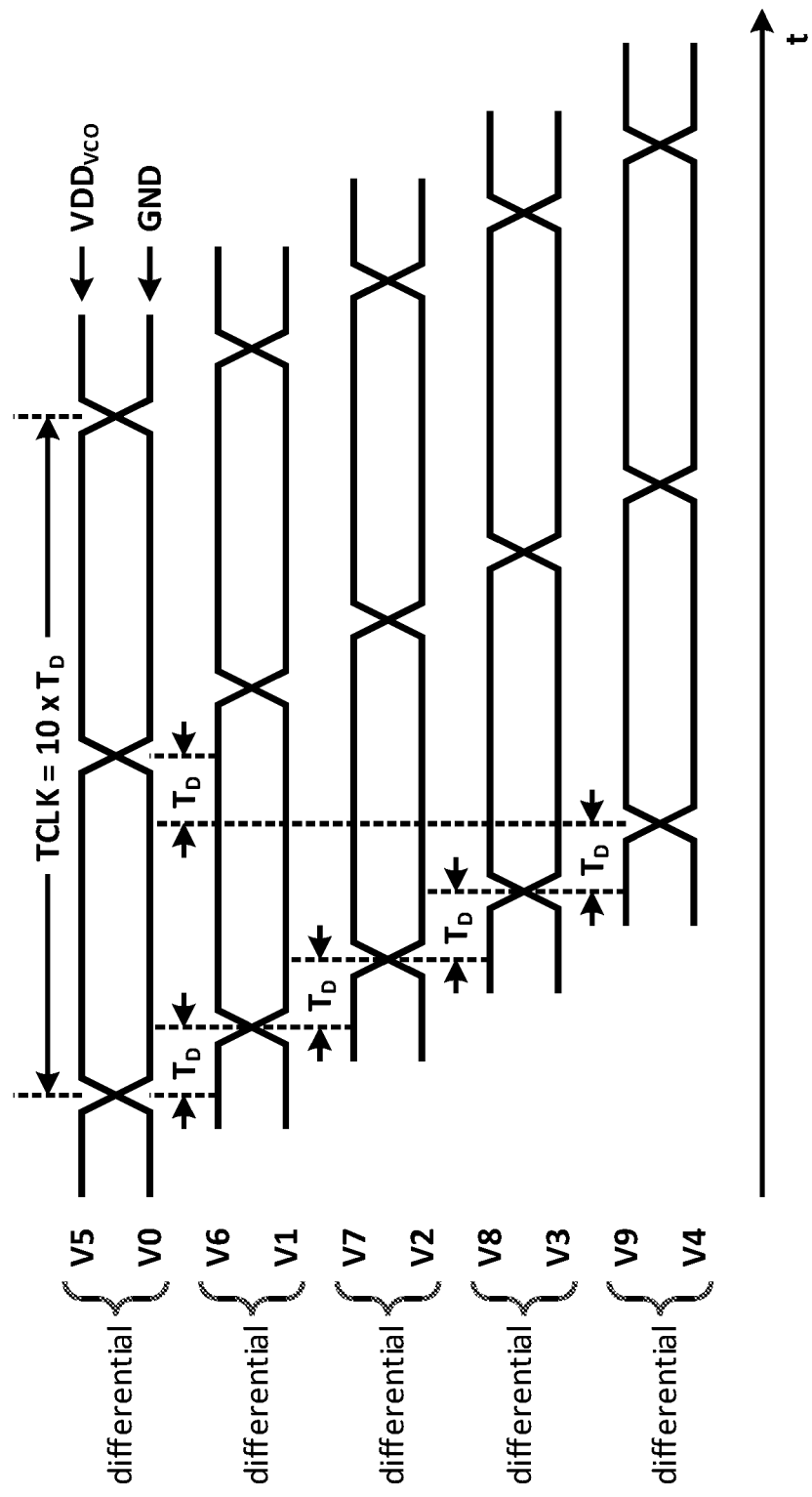
FIG. 5 is a flowchart of the working sequence of the first ring voltage-controlled oscillator provided by the present disclosure.

As shown in FIGS. 3 to 5, the working principle of the above-mentioned ring voltage-controlled oscillator is: in a steady state, after V0 at node 0 reaches $VDD_{VCO}$, V6 at node 6 drops to GND after an inverter delay $T_D$. In the same way, the circuit oscillates with $T_D$ delay between successive node voltages, so that the period TCLK of the generated clock signal is $10 \times T_D$.

It should be noted that the period of the clock signal is related to the number of differential inverting amplifiers, $TCLK = 2 \times N \times T_D$, where N is the number of differential inverting amplifiers. The aforementioned $VDD_{VCO}$ may be the oscillator power supply voltage inputted by the first level signal input terminal.

It is worth noting that the number of differential inverting amplifiers included in the ring voltage-controlled oscillator can be set according to actual needs, but in order to ensure oscillation, N must be an odd number.

Figure 6:
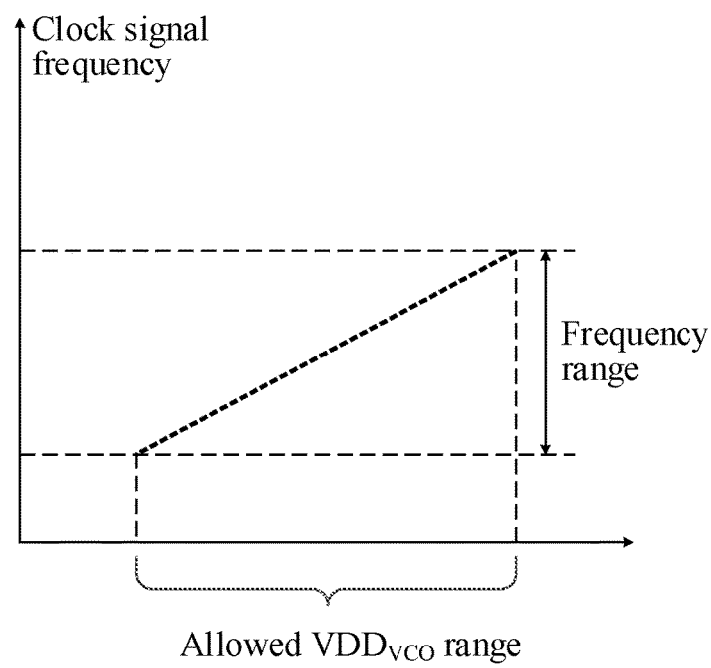
FIG. 6 is a schematic diagram of a frequency range of the signal generated by the first ring voltage-controlled oscillator provided by the present disclosure.

Referring to FIG. 6, FIG. 6 illustrates the variable range of the oscillator power supply voltage $VDD_{VCO}$ in the ring voltage-controlled oscillator, and the frequency range of the clock signal generated within the oscillator power supply voltage range allowed by the system.

In the above-mentioned ring voltage-controlled oscillator, there is a limitation on increasing the oscillation frequency, but the rising/falling time of the clock signal is short, and the clock signal rises and falls rapidly. Therefore, the above-mentioned ring voltage-controlled oscillator can effectively reduce the phase noise, and correspondingly also reduce the clock signal jitter caused by the phase noise.

Figure 7:
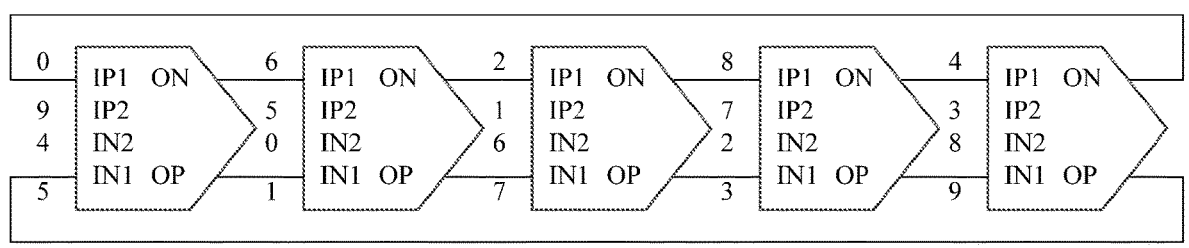
FIG. 7 is a schematic structural diagram of a second ring voltage-controlled oscillator provided by the present disclosure.
Figure 8:
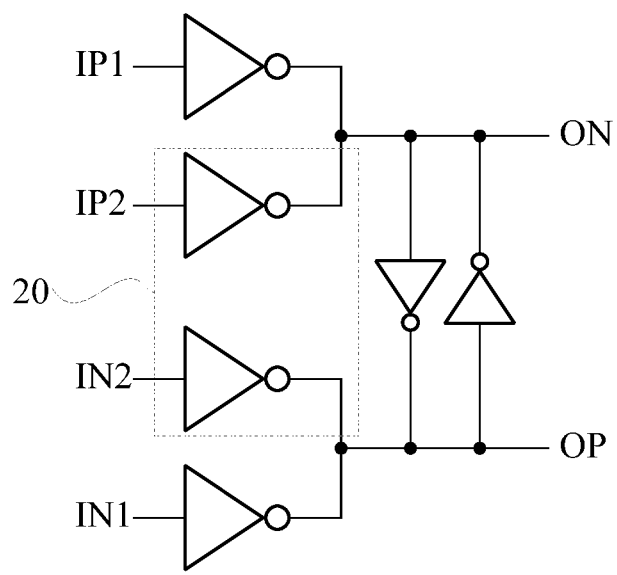
FIG. 8 is a schematic diagram of a structure which is the differential inverting amplifier in FIG. 7 added with a feedback path.

As shown in FIG. 7, the present disclosure provides a second ring voltage-controlled oscillator, wherein, based on the first ring voltage-controlled oscillator, a feed-forward path 20 is added in each stage of differential inverting amplifier. As shown in FIG. 8, FIG. 8 illustrates a schematic structural diagram of the differential inverting amplifier after a feed-forward path 20 is added.

The present disclosure provides a second ring voltage-controlled oscillator, wherein the input terminal IP2 in the feed-forward path 20 of each stage receives the signal inputted by the second input terminal IN1 of the adjacent previous stage of differential inverting amplifier, and the input terminal IN2 in the feed-forward path 20 of each stage receives the signal inputted by the first input terminal IP1 of the adjacent previous stage of differential inverting amplifier. The input terminals IP2 and IN1 of the feed-forward path 20 in the first-stage differential inverting amplifier (that is, the leftmost differential inverting amplifier in FIG. 7) receive the signals inputted by the second input terminal IN1 and the first input terminal IP1 of the last stage of differential inverting amplifier, respectively. It should be noted that, as shown in FIG. 7, nodes with the same numerical label represent the same signal is fed to those nodes.

Figure 9:
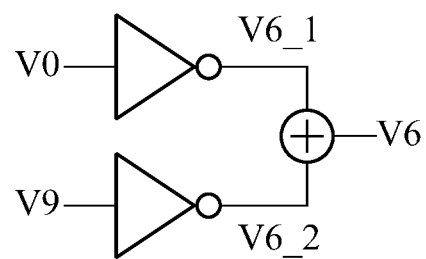
FIG. 9 is a schematic diagram of the inverter corresponding to the first output terminal after the feedback path is added.
Figure 10:
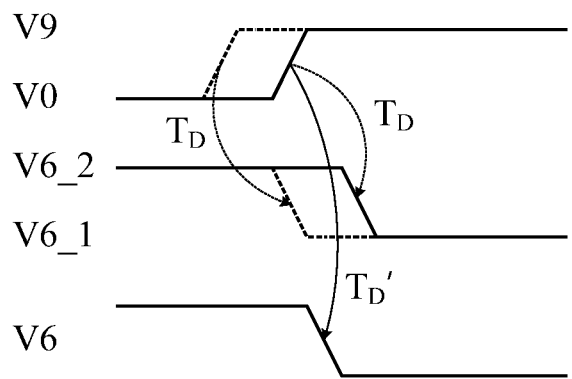
FIG. 10 is a schematic diagram of input to output delay of the inverter in FIG. 9.

Referring to FIG. 9 and FIG. 10, two dashed lines in FIG. 10 correspond to V9 and V6_2. V9 is earlier than V0, and V6_2 is earlier than V6_1. After the feed-forward path 20 is introduced, the two delay paths in FIG. 9 are merged. The delay time from V0 to V6 may be reduced by interpolating with an earlier path, such as the V9 to V6 path, for example, the delay time is reduced to $T_D'$. Therefore, by providing the feed-forward path 20, the differential compensation of phase signal can be performed more quickly for clock signal of each stage, thereby effectively increasing the oscillation frequency of the signal.

Figure 11:
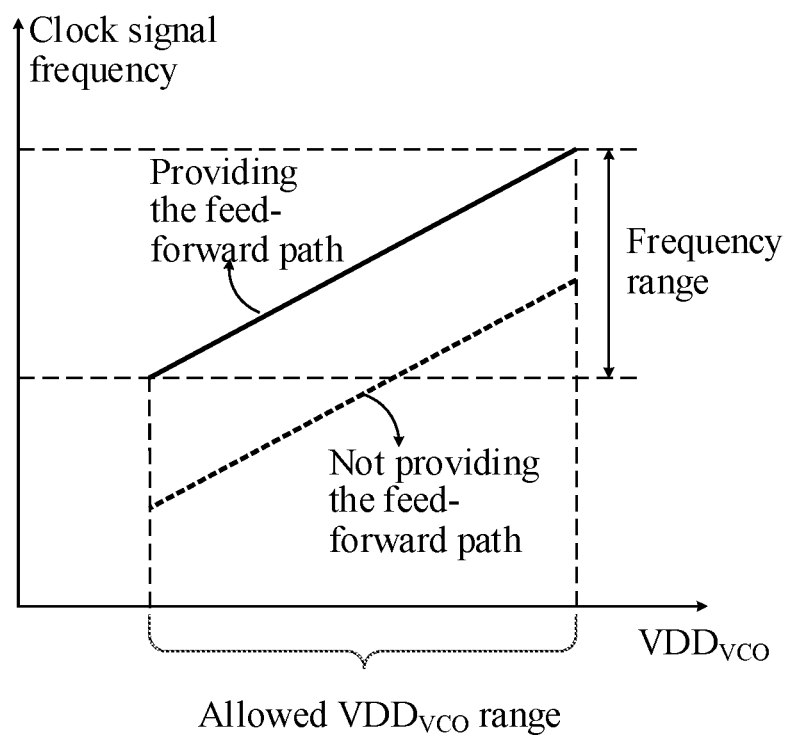
FIG. 11 is a flowchart of the working sequence of the second ring voltage-controlled oscillator provided by the present disclosure.

As shown in FIG. 11, although the oscillation frequency of the signal is increased by providing the feed-forward path 20, it is difficult to achieve low-frequency oscillation within the allowable voltage range. Moreover, under the same oscillation frequency condition, compared with the structure without the feed-forward path 20, the swing level is small, and the rising/falling time of the signal become greater. As a result, in the low-frequency domain, characteristics such as multiphase clock phase mismatch and phase noise will become worse.

Figure 12:
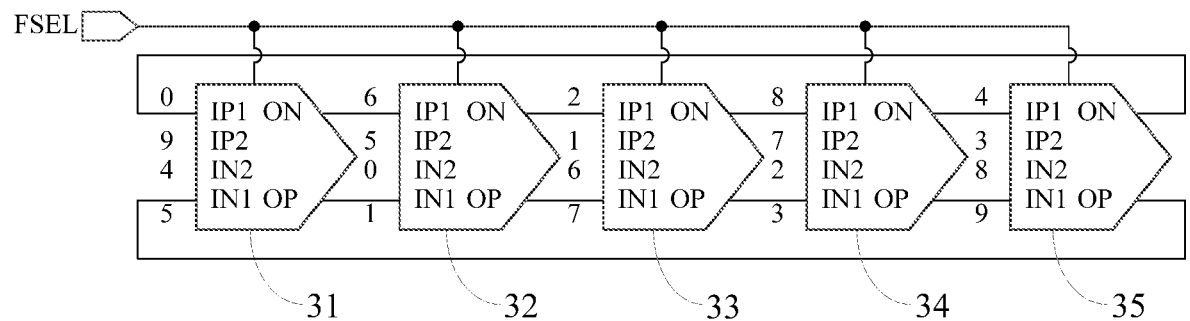
FIG. 12 is a schematic structural diagram of a voltage-controlled oscillator provided by an embodiment of the disclosure.
Figure 13:
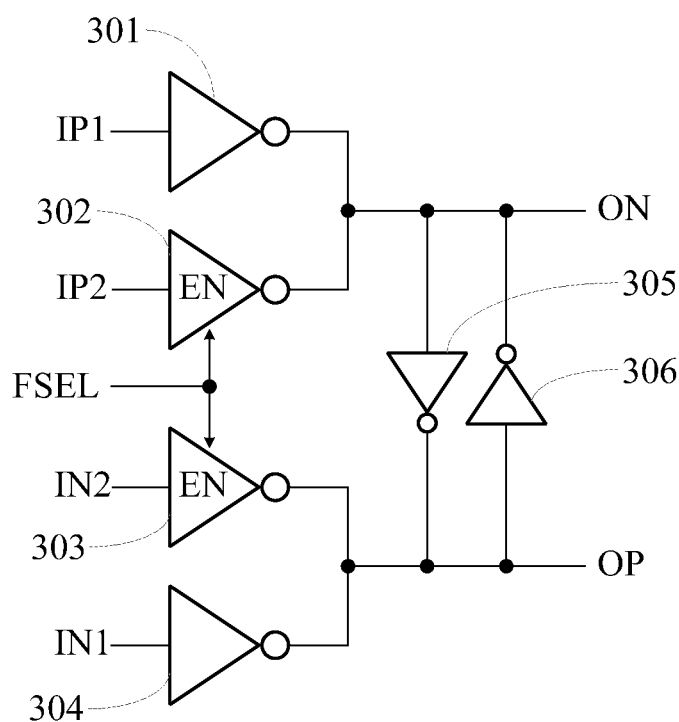
FIG. 13 is a schematic structural diagram of a delay unit in FIG. 12.

Referring to FIG. 12 and FIG. 13, an embodiment of the present disclosure provides a voltage-controlled oscillator, including:

N stages of delay units, a first output terminal (e.g., ON) of the delay unit of an X-th stage is electrically connected to a first input terminal (e.g., IP1) of the delay unit of an (X+1)-th stage, and a second output terminal (e.g., OP) of the delay unit of the X-th stage is electrically connected to a fourth input terminal (e.g., IN1) of the delay unit of the (X+1)-th stage; a second input terminal (e.g., IP2) of the delay unit of the (X+1)-th stage and a fourth input terminal of the delay unit of the X-th stage are connected to a same signal, and a third input terminal (e.g., IN2) of the delay unit of the (X+1)-th stage and a first input terminal of the delay unit of the X-th stage are connected to a same signal; a first input terminal of the delay unit of a first stage is electrically connected to a first output terminal of the delay unit of a N-th stage, a second input terminal of the delay unit of the first stage and a fourth input terminal of the delay unit of the N-th stage are connected to a same signal, a third input terminal of the delay unit of the first stage and a first input terminal of the delay unit of the N-th stage are connected to the same signal, and a fourth input terminal of the delay unit of the first stage is electrically connected to a second output terminal of the delay unit of the N-th stage; where N is an integer, $1 \leq X \leq N-1$.

As shown in FIG. 13, a delay unit of each stage includes: a first inverter 301, a second inverter 302, a third inverter 303, and a fourth inverter 304; an input terminal of the first inverter 301 is a first input terminal of a delay unit to which the first inverter 301 belongs, an input terminal of the second inverter is a second input terminal of the delay unit to which the second inverter belongs, and an input terminal of the third inverter 303 is a third input terminal of a delay unit to which the third inverter 303 belongs, an input terminal of the fourth inverter 304 is a fourth input terminal of a delay unit to which the fourth inverter 304 belongs; an output terminal of the first inverter 301 and an output terminal of the second inverter 302 are both electrically connected to a first output terminal of the delay unit to which they belong, and an output terminal of the third inverter 303 and an output terminal of the fourth inverter 304 are both electrically connected to a second output terminal of delay unit to which they belong.

Both the second inverter 302 and the third inverter 303 are electrically connected to a frequency control terminal, and whether to activate the second inverter 302 and the third inverter 303 may be controlled by the frequency control terminal.

Specifically, FIG. 12 illustrates five stages of delay units of the voltage-controlled oscillator, that is, a first-stage delay unit 31, a second-stage delay unit 32, a third-stage delay unit 33, a fourth-stage delay unit 34, and a fifth-stage delay unit 35.

Each of the delay units includes a first output terminal, a second output terminal, a first input terminal, a second input terminal, a third input terminal, and a fourth input terminal. Exemplarily, the first output terminal and the second output terminal are opposite in phase, the first input terminal and the second input terminal are of the same phase, the third input terminal and the fourth input terminal are of the same phase, the first input terminal and the third input terminal are opposite in phase, and the first input terminal and the first output terminal are opposite in phase.

It should be noted that, numbers 0-9 are labeled in FIG. 12, and nodes labeled with the same number represent the same signal is fed to those nodes.

Both the second inverter 302 and the third inverter 303 are electrically connected to the frequency control terminal, and the second inverter 302 and the third inverter 303 can be activated under the control of the frequency control terminal, so that the second inverter 302 and the third inverter 303 play a certain role in the delay unit; and the second inverter 302 and the third inverter 303 may be not activated under the control of the frequency control terminal, so that the second inverter 302 and the third inverter 303 have no function in the delay unit.

It should be noted that the voltage-controlled oscillator is used in an interface system based on a phase-locked loop (PLL) to provide the system with a clock signal that meets frequency requirements.

When the second inverter 302 and the third inverter 303 are activated under the control of the frequency control terminal, the structure of the delay unit is the same as the structure of the differential inverting amplifier after the feed-forward path 20 is added as shown in FIG. 8. When the second inverter 302 and the third inverter 303 are not activated under the control of the frequency control terminal, the structure of the delay unit is the same as the structure of the differential inverting amplifier in FIG. 2.

As can be known from the specific structure of the above-mentioned voltage-controlled oscillator, in the voltage-controlled oscillator provided by the embodiment of the present disclosure, when the required signal frequency is high, the second inverter 302 and the third inverter 303 in the delay unit can be activated, and when the required signal frequency is low, the second inverter 302 and the third inverter 303 in the delay unit can be not activated; therefore, the voltage-controlled oscillator provided by the present disclosure can selectively control whether to activate the feed-forward path 20 according to actual needs, that is, control the delay unit to assume the structure as shown in FIG. 8 or assume the structure as shown FIG. 2, thus, not only the frequency range of the signal that can be generated is expanded, but also the generation of a clock signal with large swing level, small rising/falling time, and good multi-phase clock phase mismatch and phase noise characteristics is realized.

Figure 15:
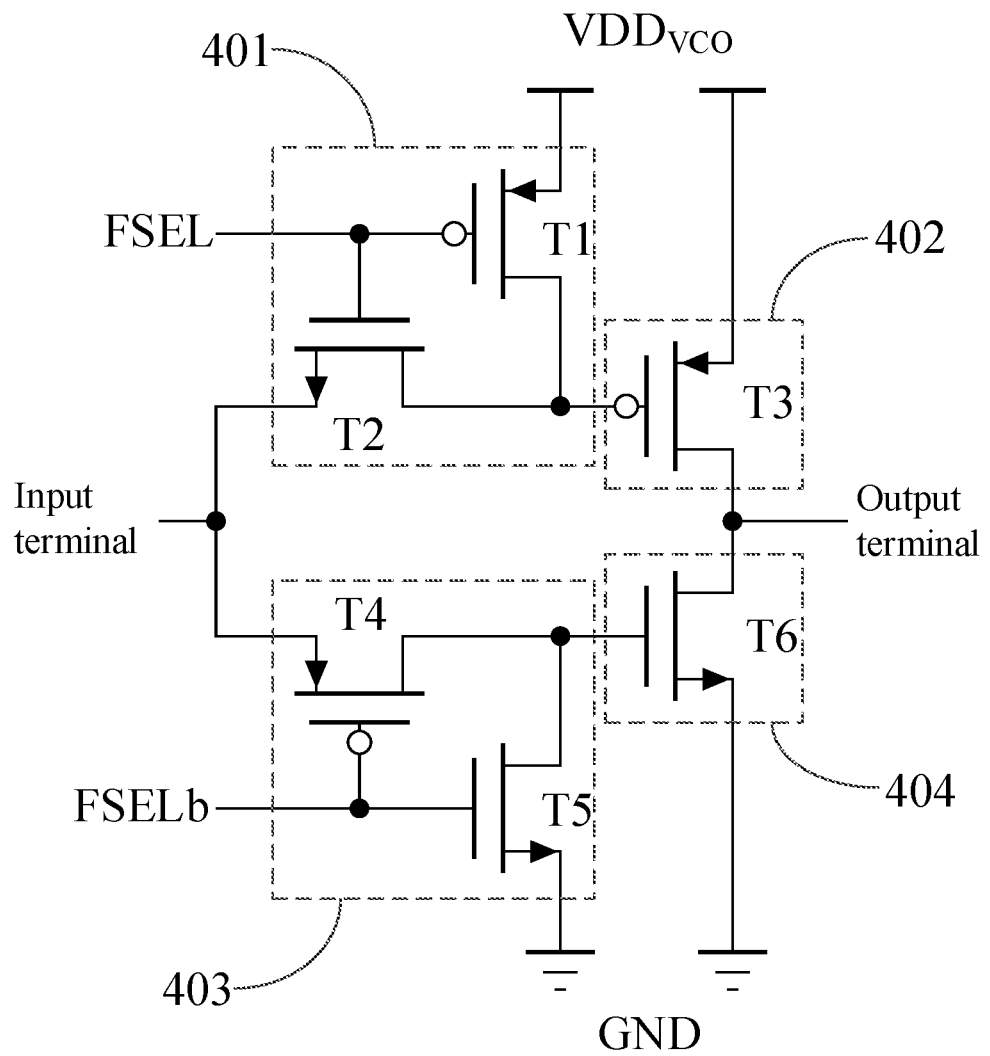
FIG. 15 is a schematic diagram of a first structure of the second inverter and the third inverter provided by an embodiment of the present disclosure.

As shown in FIG. 15, in some embodiments, the second inverter 302 and/or the third inverter 303 includes: a first control unit 401, a second control unit 402, a third control unit 403, and a fourth control unit 404; the frequency control terminal includes a first frequency control terminal FSEL and a second frequency control terminal FSELb, wherein the first frequency control terminal outputs a signal opposite in phase to a signal outputted by the second frequency control terminal.

The first control unit 401 is electrically connected to the first frequency control terminal FSEL, a first level signal input terminal, an input signal terminal, and a control terminal of the second control unit 402, respectively, and is configured to, under the control of the first frequency control terminal, turn on or turn off a connection between the first level signal input terminal and the control terminal of the second control unit 402, and turn on or turn off a connection between the input signal terminal and the control terminal of the second control unit.

The second control unit 402 is also electrically connected to the first level signal input terminal and an output terminal of an inverter to which the second control unit belongs, and is configured to turn on or turn off a connection between the first level signal input terminal and the output terminal under control of a control terminal included in the second control unit.

The third control unit 403 is electrically connected to the second frequency control terminal FSELb, a second level signal input terminal, an input signal terminal, and a control terminal of the fourth control unit 404, respectively, and is configured to, under control of the second frequency control terminal FSELb, turn on or turn off a connection between the second level signal input terminal and the control terminal of the fourth control unit 404, and turn on or turn off of a connection between the input signal terminal and the control terminal of the fourth control unit 404.

The fourth control unit 404 is also electrically connected to the second level signal input terminal and an output terminal of an inverter to which the fourth control unit belongs, and is configured to turn on or turn off a connection between the second level signal input terminal and the output terminal under control of a control terminal included in the fourth control unit.

The input signal terminal is a second input terminal or a third input terminal.

Specifically, the frequency control terminal includes a first frequency control terminal FSEL and a second frequency control terminal FSELb, and an output signal of the first frequency control terminal FSEL and an output signal of the second frequency control terminal FSELb are opposite in phase. Exemplarily, the output signal of the second frequency control terminal FSELb may be generated from the output signal of the first frequency control terminal FSEL.

Exemplarily, when the first frequency control signal outputted by the first frequency control terminal FSEL is set to a high level, the second frequency control signal outputted by the second frequency control terminal FSELb is at a low level, and the second inverter 302 and/or the third inverter 303 are controlled to be activated. Exemplarily, when the first frequency control signal outputted by the first frequency control terminal FSEL is set to a low level, the second frequency control signal outputted by the second frequency control terminal FSELb is at a high level, and the second inverter 302 and/or the third inverter 303 are controlled to be not activated.

It should be noted that when the second inverter 302 adopts the above structure, the input signal terminal is the second input terminal. When the third inverter 303 adopts the above structure, the input signal terminal is the third input terminal.

Exemplarily, when the first frequency control signal outputted by the first frequency control terminal FSEL is set to a high level, the first control unit 401 controls to turn off the connection between the first level signal input terminal and the control terminal of the second control unit 402, and turn on the connection between the input signal terminal and the control terminal of the second control unit 402; when the first frequency control signal outputted by the first frequency control terminal FSEL output is set to a low level, the first control unit 401 controls to turn on the connection between the first level signal input terminal and the control terminal of the second control unit 402, and controls to turn off the connection between the input signal terminal and the control terminal of the second control unit 402.

Exemplarily, when the control terminal of the second control unit 402 receives a high-level signal, the second control unit 402 controls to turn off the connection between the first level signal input terminal and the output terminal; when the control terminal of the second control unit 402 receives a low-level signal, the second control unit 402 controls to turn on the connection between the first level signal input terminal and the output terminal.

Exemplarily, when the second frequency control signal outputted by the second frequency control terminal FSELb is set to a high level, the third control unit 403 controls to turn on the connection between the second level signal input terminal and the control terminal of the fourth control unit 404 and controls to turn off the connection between the input signal terminal and the control terminal of the fourth control unit 404; when the second frequency control signal outputted by the second frequency control terminal FSELb is set to low level, the third control unit 403 controls to turn off the connection between the second level signal input terminal and the control terminal of the fourth control unit 404, and controls to turn on the connection between the input signal terminal and the control terminal of the fourth control unit 404.

Exemplarily, when the control terminal of the fourth control unit 404 receives a high-level signal, the fourth control unit 404 controls to turn on the connection between the second level signal input terminal and the output terminal; when the control terminal of the fourth control unit 404 receives a low-level signal, the fourth control unit 404 controls to turn off the connection between the second level signal input terminal and the output terminal.

In the voltage-controlled oscillator provided by the foregoing embodiment, the added second inverter 302 and the third inverter 303 have a simple structure and will not cause the area of the voltage-controlled oscillator to increase too much. Therefore, while satisfying the requirement of a small area, the voltage-controlled oscillator provided by the above-mentioned embodiments can not only achieve a wide signal frequency range, but also have excellent clock characteristics in the entire frequency range.

As shown in FIG. 15, in some embodiments, the first control unit 401 includes a first transistor T1 and a second transistor T2, the second control unit 402 includes a third transistor T3, the third control unit 403 includes a fourth transistor T4 and a fifth transistor T5, and the fourth control unit 404 includes a sixth transistor T6.

A gate electrode of the first transistor T1 and a gate electrode of the second transistor T2 are both electrically connected to the first frequency control terminal FSEL, and a first electrode of the first transistor T1 is electrically connected to the first level signal input terminal, a second electrode of the first transistor T1 and a second electrode of the second transistor T2 are both electrically connected to a gate electrode of the third transistor T3, and a first electrode of the second transistor T2 is electrically connected to the input signal terminal.

A first electrode of the third transistor T3 is electrically connected to the first level signal input terminal, and a second electrode of the third transistor T3 is electrically connected to an output terminal of an inverter to which the third transistor belongs.

A gate electrode of the fourth transistor T4 and a gate electrode of the fifth transistor T5 are both electrically connected to the second frequency control terminal FSELb, a first electrode of the fourth transistor T4 is electrically connected to the input signal terminal, a second electrode of the four transistor T4 and a second electrode of the fifth transistor T5 are both electrically connected to a gate electrode of the sixth transistor T6, and a first electrode of the fifth transistor T5 is electrically connected to the second level signal input terminal.

A first electrode of the sixth transistor T6 is electrically connected to the second level signal input terminal, and a second electrode of the sixth transistor T6 is electrically connected to an output terminal of an inverter to which the sixth transistor belongs.

Exemplarily, the first transistor T1, the third transistor T3, and the fourth transistor T4 are all P-type transistors, and the second transistor T2, the fifth transistor, and the sixth transistor T6 are all N-type transistors.

Exemplarily, the first level signal inputted by the first level signal input terminal is the oscillator power supply voltage $VDD_{VCO}$, and the second level signal inputted by the second level signal input terminal is the ground signal GND.

When the first frequency control signal inputted by the first frequency control terminal FSEL is at a high level, the first transistor T1 is turned off and the second transistor T2 is turned on; when the second transistor T2 is turned on, the signal inputted by the input signal terminal is written into the gate electrode of the third transistor T3. When the second frequency control signal inputted by the second frequency control terminal FSELb is at a low level, the fourth transistor T4 is turned on and the fifth transistor T5 is turned off; when the fourth transistor T4 is turned on, the signal inputted by the input signal terminal is written into the gate electrode of the sixth transistor T6. Thus, the sixth transistor T6 is controlled to be turned on or off. In this case, when the signal inputted by the input signal terminal is at a high level, the sixth transistor T6 is turned on, so that the output terminal output a second level signal; when the signal inputted by the input signal terminal is at a low level, the third transistor T3 is turned on, so that the output terminal outputs a first level signal.

Figure 16:
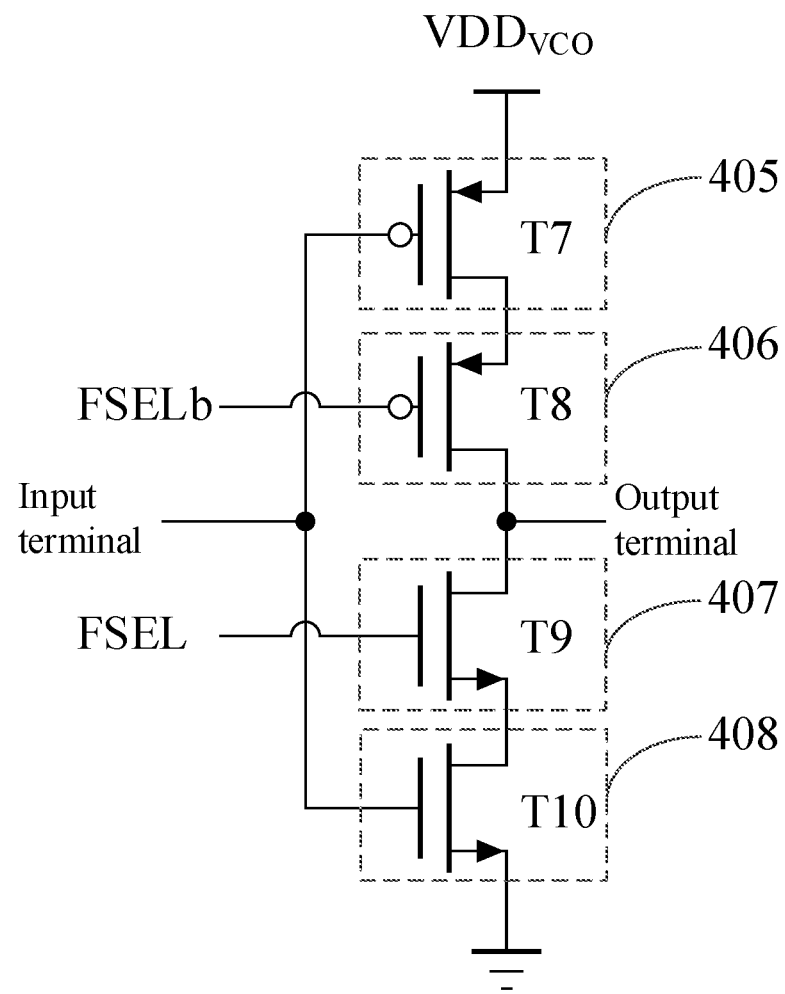
FIG. 16 is a schematic diagram of a second structure of the second inverter and the third inverter provided by an embodiment of the present disclosure.

As shown in FIG. 16, in some embodiments, the second inverter 302 and/or the third inverter 303 includes: a fifth control unit 405, a sixth control unit 406, a seventh control unit 407, and an eighth control unit 408; the frequency control terminal includes a first frequency control terminal FSEL and a second frequency control terminal FSELb, wherein the first frequency control terminal outputs a signal opposite in phase to a signal outputted by the second frequency control terminal.

The fifth control unit 405 is electrically connected to the input signal terminal, the first level signal input terminal, and an input terminal of the sixth control unit 406, and is configured to control the turn on or turn off of the connection between the first level signal input terminal and the input terminal of the sixth control unit 406 under the control of the input signal terminal.

The sixth control unit 406 is also electrically connected to the second frequency control terminal FSELb and an output terminal of an inverter to which the sixth control unit belongs, and is configured to control the turn on or turn off of electrical connection between the input terminal included in the sixth control unit and the output terminal under the control of the second frequency control terminal FSELb.

The seventh control unit 407 is electrically connected to the first frequency control terminal FSEL, an output terminal of an inverter to which the seventh control unit belongs, and an output terminal of the eighth control unit 408, respectively, and is configured to control the turn on or off the connection between the output terminal of the inverter to which the seventh control unit belongs and the output terminal of the eighth control unit 408 under the control of the first frequency control terminal FSELb.

The eighth control unit 408 is also connected to the input signal terminal and the second level signal input terminal respectively, and is configured to control the turn on or off of the connection between the second level signal input terminal and the output terminal of the eighth control unit 408 under the control of the input signal terminal.

The input signal terminal is a second input terminal or a third input terminal.

Specifically, the frequency control terminal includes a first frequency control terminal FSEL and a second frequency control terminal FSELb, and an output signal of the first frequency control terminal FSEL and an output signal of the second frequency control terminal FSELb have opposite phases. Exemplarily, the output signal of the second frequency control terminal FSELb may be generated from the output signal of the first frequency control terminal FSEL.

Exemplarily, when the first frequency control signal outputted by the first frequency control terminal FSEL is set to a high level, the second frequency control signal outputted by the second frequency control terminal FSELb is at a low level, and the second inverter 302 and/or the third inverter 303 are controlled to be activated. Exemplarily, when the first frequency control signal outputted by the first frequency control terminal FSEL is set to a low level, the second frequency control signal outputted by the second frequency control terminal FSELb is at a high level, and the second inverter 302 and/or the third inverter 303 are controlled to be not activated.

It should be noted that, when the second inverter 302 adopts the above structure, the input signal terminal is the second input terminal. When the third inverter 303 adopts the above structure, the input signal terminal is the third input terminal.

Exemplarily, when the first frequency control signal outputted by the first frequency control terminal FSEL is set to a high level, the seventh control unit 407 controls to turn on the connection between the output terminal of the inverter to which the seventh control unit belongs and the output terminal of the eighth control unit 408.

Exemplarily, when the second frequency control signal outputted by the second frequency control terminal FSELb is set to a low level, the sixth control unit 406 controls to turn on the connection between the output terminal of the inverter to which the sixth control unit belongs and the output terminal of the fifth control unit 405.

Exemplarily, when the signal inputted by the input signal terminal is at a high level, the eighth control unit 408 controls to turn on the connection between the second level signal input terminal and the output terminal of the eighth control unit 408, when the first frequency control signal is at a high level, the second level signal input terminal is connected to the output terminal of the inverter, so that the output terminal outputs the second level signal.

Exemplarily, when the signal inputted by the input signal terminal is at a low level, the fifth control unit 405 controls to turn on the connection between the first level signal input terminal and the input terminal of the sixth control unit 406, when the second frequency control signal is at a low level, the first level signal input terminal is connected to the output terminal of the inverter, so that the output terminal outputs the first level signal.

In the voltage-controlled oscillator provided by the foregoing embodiment, the added second inverter 302 and the third inverter 303 have a simple structure and will not cause the area of the voltage-controlled oscillator to increase too much. Therefore, while satisfying the requirement of a small area, the voltage-controlled oscillator provided by the above-mentioned embodiments can not only achieve a wide signal frequency range, but also have excellent clock characteristics in the entire frequency range.

As shown in FIG. 16, in some embodiments, the fifth control unit 405 includes a seventh transistor T7, the sixth control unit 406 includes an eighth transistor T8, the seventh control unit 407 includes a ninth transistor T9, and the eighth control unit 408 includes a tenth transistor T10.

A gate electrode of the seventh transistor T7 is electrically connected to the input signal terminal, a first electrode of the seventh transistor T7 is electrically connected to the first level signal input terminal, and a second electrode of the seventh transistor T7 is electrically connected to a first electrode of the eighth transistor T8.

A gate electrode of the eighth transistor T8 is electrically connected to the second frequency control terminal FSELb, and a second electrode of the eighth transistor T8 is electrically connected to an output terminal of an inverter to which the eighth transistor belongs.

A gate electrode of the ninth transistor T9 is connected to the first frequency control terminal FSEL, a first electrode of the ninth transistor T9 is connected to a second electrode of the tenth transistor T10, and a second electrode of the ninth transistor T9 is electrically connected to an output terminal of an inverter to which the ninth transistor belongs.

A gate electrode of the tenth transistor T10 is connected to the input signal terminal, and a first electrode of the tenth transistor T10 is connected to the second level signal input terminal.

Exemplarily, the seventh transistor T7 and the eighth transistor T8 are both P-type transistors, and the ninth transistor T9 and the tenth transistor T10 are both N-type transistors.

Exemplarily, the first level signal inputted by the first level signal input terminal is a positive power signal, and the second level signal inputted by the second level signal input terminal is the ground signal GND.

When the first frequency control signal inputted by the first frequency control terminal FSEL is at a high level, the ninth transistor T9 is turned on; when the second frequency control signal inputted by the second frequency control terminal FSELb is at a low level, the sixth transistor T6 is turned on; when the signal inputted by the input signal terminal is at a high level, the tenth transistor T10 is turned on; and when the signal inputted by the input signal terminal is at a low level, the fifth transistor T5 is turned on.

As shown in FIG. 13, in some embodiments, the delay unit of each stage further includes: a fifth inverter 305 and a sixth inverter 306.

An input terminal of the fifth inverter 305 is electrically connected to a first output terminal of a delay unit to which the fifth inverter belongs, and an output terminal of the fifth inverter 306 is electrically connected to a second output terminal of the delay unit to which the fifth inverter belongs.

An input terminal of the sixth inverter 306 is electrically connected to a second output terminal of a delay unit to which the sixth inverter belongs, and an output terminal of the sixth inverter 306 is electrically connected to a first output terminal of the delay unit to which the sixth inverter belongs.

By providing the fifth inverter 305 and the sixth inverter 306, a differential signal of ON and OP can be better realized.

Figure 14:
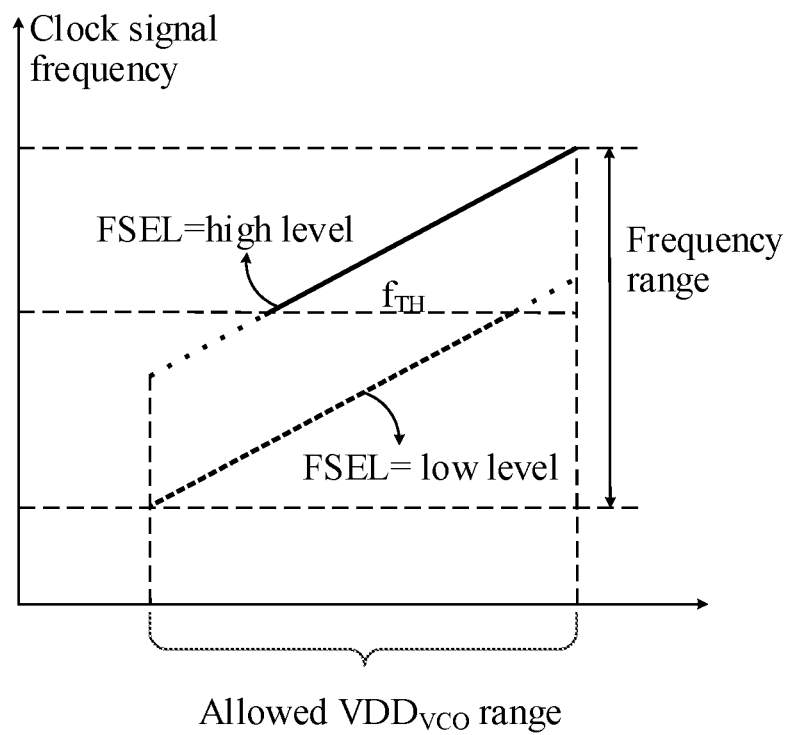
FIG. 14 is a schematic diagram of a frequency range of the signal generated by the voltage-controlled oscillator provided by an embodiment of the present disclosure.
Figure 17:
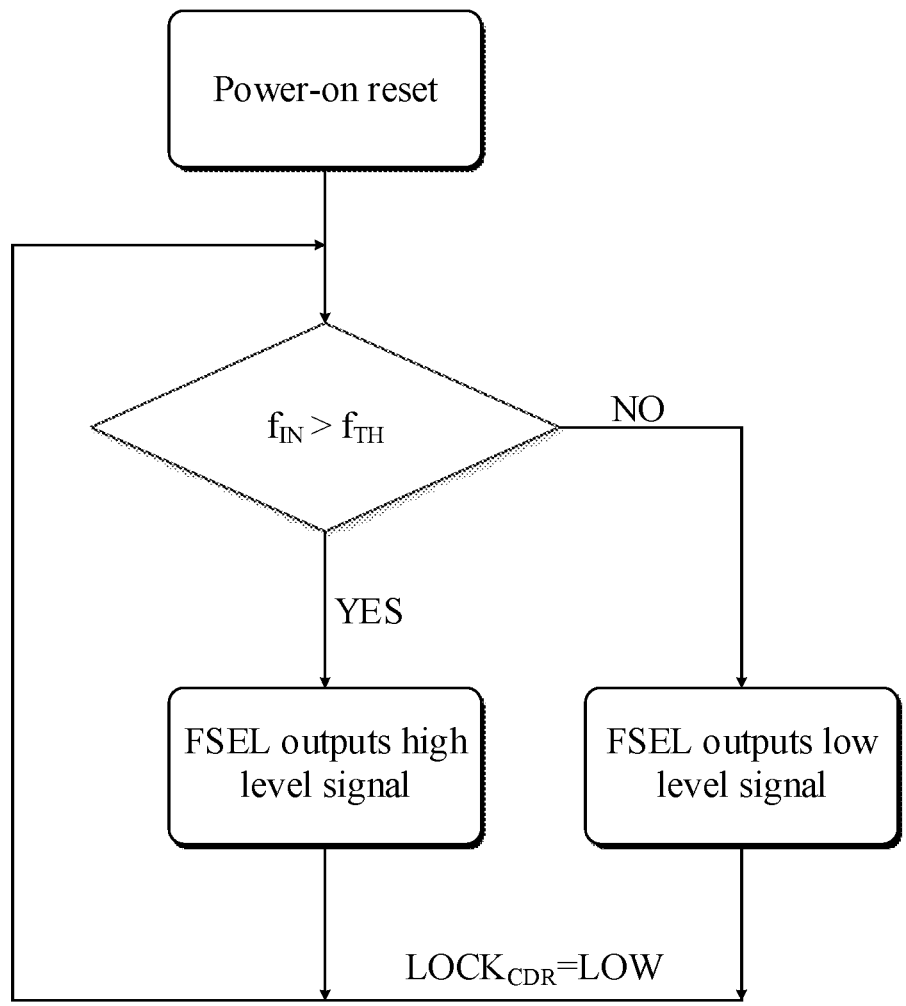
FIG. 17 is a schematic flowchart of setting a first frequency control signal according to an embodiment of the disclosure.

As shown in FIG. 14 and FIG. 17, in some embodiments, the voltage-controlled oscillator further includes:

a frequency comparison module, configured to compare an input data frequency $f_{IN}$ with a preset reference frequency $f_{TH}$ to determine a level of a frequency control signal outputted by the frequency control terminal, so as to control whether to activate the second inverter 302 and the third inverter 303.

Specifically, the preset reference frequency $f_{TH}$ can be set according to the frequency ranges and swing levels of the signals generated by the voltage-controlled oscillators of the structures of FIG. 2 and FIG. 8, and action fields of the voltage-controlled oscillators of the structures of FIG. 2 and FIG. 8.

Exemplarily, when the input data frequency $f_{IN}$ is lower than the preset reference frequency $f_{TH}$, the first frequency control signal inputted by the first frequency control terminal FSEL is controlled to be at a low level, thereby the second inverter 302 and the third inverter 303 are controlled to be not activated to maintain sufficient swing level.

When the input data frequency $f_{IN}$ is higher than the preset reference frequency $f_{TH}$, the first frequency control signal inputted by the first frequency control terminal FSEL is controlled to be at a high level, thereby the second inverter 302 and the third inverter 303 are controlled to be activated to increase the maximum action frequency and obtain the widest frequency range.

It should be noted that a specific method of setting the first frequency control signal inputted by the first frequency control terminal FSEL includes: the first frequency control signal is provided to the first frequency control terminal FSEL by a pin external to the IC; or, in the case that there is no external control, the first frequency control signal can also be automatically controlled by an internal frequency sensing circuit of the IC. As shown in FIG. 17, a manner to automatically control the first frequency control signal inside the IC is illustrated. When the IC is powered, the frequency comparison module can be used to judge the input data frequency $f_{IN}$ and set the first frequency control signal.

It is worth noting that, the internal clock and data recovery circuit (CDR) maintains the initially set first frequency control signal under normal conditions. When an abnormal situation occurs, the CDR becomes UNLOCK, that is, set $LOCK_{CDR}$=Low, at this time, $f_{IN}$ and $f_{TH}$ need to be judged again to reset an appropriate first frequency control signal.

The above-mentioned normal situation means that in a receiver, a frequency and phase of the recovered clock are synchronized with the input data, and a bit error rate of the recovered data reaches a target. The above-mentioned abnormal situation means that in a receiver, the frequency or phase of the recovered clock are not synchronized with the input data, and the bit error rate will miss the target, and the screen refresh frequency changes.

The embodiments of the present disclosure further provides a P2P interface circuit including the voltage-controlled oscillator provided in the above-mentioned embodiments.

Since in the voltage-controlled oscillator provided by the above embodiment of the present disclosure, the second inverter 302 and the third inverter 303 in the delay unit can be activated when the required signal frequency is high, and the second inverter 302 and the third inverter 303 in the delay unit can be not activated when the required signal frequency is low, the voltage-controlled oscillator provided by the above embodiment can selectively control whether to activate the feed-forward path 20 according to actual needs, that is, control the delay unit to assume the structure as shown in FIG. 8 or assume the structure as shown FIG. 2, thus, not only the frequency range of the signal that can be generated is expanded, but also the generation of a clock signal with large swing level, small rising/falling time, and good multi-phase clock phase mismatch and phase noise characteristics is realized.

Therefore, the P2P interface circuit provided by the embodiment of the present disclosure also has the above-mentioned beneficial effects when it includes the above-mentioned voltage-controlled oscillator, and the description thereof will not be repeated here.

An embodiment of the present disclosure further provides an electronic device including the P2P interface circuit provided in the above-mentioned embodiment.

The electronic device provided by the embodiment of the present disclosure also has the above-mentioned beneficial effects of the P2P interface circuit when it includes the above-mentioned P2P interface circuit, and the description thereof will not be repeated here.

Exemplarily, the electronic device includes any product or component with a display function, such as a TV, a display, a digital photo frame, a mobile phone, a tablet computer, and the like.

An embodiment of the present disclosure further provides a voltage-controlled oscillator control method, applied to the voltage-controlled oscillator provided by the above-mentioned embodiments, and the control method includes:

controlling whether to activate the second inverter 302 and the third inverter 303 under the control of the frequency control terminal.

While controlling the voltage-controlled oscillator with the control method provided by the embodiment of the present disclosure, when the required signal frequency is high, the second inverter 302 and the third inverter 303 in the delay unit can be activated, and when the required signal frequency is low, the second inverter 302 and the third inverter 303 in the delay unit can be not activated; therefore, when the voltage-controlled oscillator is controlled with the control method provided by the embodiment of the present disclosure, whether to activate the feed-forward path 20 can be selectively controlled according to actual needs, that is, the delay unit can be controlled to assume the structure as shown in FIG. 8 or assume the structure as shown FIG. 2, thus, not only the frequency range of the signal that can be generated is expanded, but also the generation of a clock signal with large swing level, small rising/falling time, and good multi-phase clock phase mismatch and phase noise characteristics is realized.

In some embodiments, the voltage controlled oscillator further includes: a frequency comparison module;

the controlling whether to activate the second inverter 302 and the third inverter 303 under the control of the frequency control terminal specifically includes:

comparing, through the frequency comparison module, an input data frequency with a preset reference frequency, controlling the second inverter 302 and the third inverter 303 to be activated when the input data frequency is greater than the preset reference frequency, and controlling the second inverter 302 and the third inverter 303 to be not activated when the input data frequency is less than the preset reference frequency.

Exemplarily, when the input data frequency $f_{IN}$ is lower than the preset reference frequency $f_{IN}$, the first frequency control signal inputted by the first frequency control terminal FSEL is controlled to be at a low level, thereby the second inverter 302 and the third inverter 303 are controlled to be not activated to maintain sufficient swing level.

When the input data frequency $f_{IN}$ is higher than the preset reference frequency $f_{TH}$, the first frequency control signal inputted by the first frequency control terminal FSEL is controlled to be at a high level, thereby the second inverter 302 and the third inverter 303 are controlled to be activated to increase the maximum action frequency and obtain the widest frequency range.

It is noted, the above embodiments in the description have been described in a progressive manner, and the description of each embodiment focuses on its difference from other embodiments, thus the same or similar part among various embodiments may be referred with each other. Especially, the method embodiments are substantially similar to the product embodiments, and thus have been described in a simple manner; for description of relevant part, reference may be made to the description of the product embodiments.

Unless otherwise defined, the technical or scientific terms used in the present disclosure shall have the ordinary meanings understood by those of ordinary skill in the art to which the present disclosure belongs. The terms "first", "second", and the like used in this disclosure do not indicate any order, quantity, or priority, but are only used to distinguish different components. The terms "include", "have" or any variations thereof are intended to mean that an element or article followed by such a term encompasses a list of elements or articles preceded by such a term, or equivalents thereof, without precluding other elements or articles. Expressions such as "connection", "couple", or "connected" are not limited to physical or mechanical connections, but may include electrical connections, whether direct or indirect. Such words as "on", "under", "left" and "right" are merely used to represent relative position relationship, and when an absolute position of the object is changed, the relative position relationship may be changed too.

It will be understood that when an element, such as a layer, film, region or substrate, is referred to as being "on" or "under" another element, it can be directly on or directly under the other element, or intervening elements may also be present.

The specific features, structures, materials or characteristics in the description of forgoing implementations may be combined in any one or more embodiments or examples in proper manners.

The above descriptions merely describe specific implementations of the present disclosure, and the scope of the present disclosure is not limited thereto. Any modifications or substitutions easily occurring to a person of ordinary skill in the art without departing from the principle of the present disclosure shall fall within the scope of the present disclosure. Therefore, the scope of the present disclosure is defined by the scope of the claims.

What is claimed is:

1. A voltage-controlled oscillator, comprising:
    N stages of delay units, a first output terminal of the delay unit of an X-th stage is electrically connected to a first input terminal of the delay unit of an (X+1)-th stage, and a second output terminal of the delay unit of the X-th stage is electrically connected to a fourth input terminal of the delay unit of the (X+1)-th stage; a second input terminal of the delay unit of the (X+1)-th stage and the fourth input terminal of the delay unit of the X-th stage are connected to a same signal, and a third input terminal of the delay unit of the (X+1)-th stage and a first input terminal of the delay unit of the X-th stage are connected to a same signal; a first input terminal of the delay unit of a first stage is electrically connected to a first output terminal of the delay unit of a N-th stage, a second input terminal of the delay unit of the first stage and a fourth input terminal of the delay unit of the N-th stage are connected to a same signal, a third input terminal of the delay unit of the first stage and a first input terminal of the delay unit of the N-th stage are connected to a same signal, and a fourth input terminal of the delay unit of the first stage is electrically connected to a second output terminal of the delay unit of the N-th stage; wherein N is an integer, $1 \leq X \leq N-1$;
    the delay unit of each stage comprises: a first inverter, a second inverter, a third inverter, and a fourth inverter; an input terminal of the first inverter is a first input terminal of the delay unit to which the first inverter belongs, an input terminal of the second inverter is a second input terminal of the delay unit to which the second inverter belongs, an input terminal of the third inverter is a third input terminal of the delay unit to which the third inverter belongs, and an input terminal of the fourth inverter is a fourth input terminal of the delay unit to which the fourth inverter belongs; an output terminal of the first inverter and an output terminal of the second inverter are both electrically connected to a first output terminal of the delay unit to which the first inverter and the second inverter belong, and an output terminal of the third inverter and an output terminal of the fourth inverter are both electrically connected to a second output terminal of the delay unit to which the third inverter and the fourth inverter belong;
    both the second inverter and the third inverter are electrically connected to a frequency control terminal, and whether to activate the second inverter and the third inverter is controlled by the frequency control terminal;
    wherein the voltage-controlled oscillator further comprises a frequency comparison module, the frequency comparison module is configured to compare an input data frequency with a preset reference frequency to determine a level of a frequency control signal outputted by the frequency control terminal, so as to activate the second inverter and the third inverter when the input data frequency is greater than the preset reference frequency, and not to activate the second inverter and the third inverter when the input data frequency is less than the preset reference frequency.

2. The voltage-controlled oscillator according to claim 1, wherein the second inverter and/or the third inverter comprises: a first control unit, a second control unit, a third control unit, and a fourth control unit; the frequency control terminal comprises a first frequency control terminal and a second frequency control terminal, wherein the first frequency control terminal outputs a signal inverted with a signal outputted by the second frequency control terminal;

the first control unit is electrically connected to the first frequency control terminal, a first level signal input terminal, an input signal terminal, and a control terminal of the second control unit, respectively, and the first control unit is configured to, under control of the first frequency control terminal, turn on or turn off a connection between the first level signal input terminal and the control terminal of the second control unit, and turn on or turn off a connection between the input signal terminal and the control terminal of the second control unit;

the second control unit is also electrically connected to the first level signal input terminal and an output terminal of an inverter to which the second control unit belongs, respectively, and the second control unit is configured to, under control of the control terminal of the second control unit, turn on or turn off a connection between the first level signal input terminal and the output terminal;

the third control unit is electrically connected to the second frequency control terminal, a second level signal input terminal, the input signal terminal, and a control terminal of the fourth control unit, respectively, and the third control unit is configured to, under control of the second frequency control terminal, turn on or turn off a connection between the second level signal input terminal and the control terminal of the fourth control unit, and turn on or turn off a connection between the input signal terminal and the control terminal of the fourth control unit;

the fourth control unit is also electrically connected to the second level signal input terminal and an output terminal of an inverter to which the fourth control unit belongs, respectively, and the fourth control unit is configured to, under control of a control terminal of the fourth control unit, turn on or turn off a connection between the second level signal input terminal and the output terminal;

the input signal terminal is a second input terminal or a third input terminal.

3. The voltage-controlled oscillator according to claim 2, wherein the first control unit comprises a first transistor and a second transistor, the second control unit comprises a third transistor, the third control unit comprises a fourth transistor and a fifth transistor, and the fourth control unit comprises a sixth transistor;

a gate electrode of the first transistor and a gate electrode of the second transistor are both electrically connected to the first frequency control terminal, and a first electrode of the first transistor is electrically connected to the first level signal input terminal, a second electrode of the first transistor and a second electrode of the second transistor are both electrically connected to a gate electrode of the third transistor, and a first electrode of the second transistor is electrically connected to the input signal terminal;

a first electrode of the third transistor is electrically connected to the first level signal input terminal, and a second electrode of the third transistor is electrically connected to an output terminal of an inverter to which the third transistor belongs;

a gate electrode of the fourth transistor and a gate electrode of the fifth transistor are both electrically connected to the second frequency control terminal, a first electrode of the fourth transistor is electrically connected to the input signal terminal, a second electrode of the four transistor and a second electrode of the fifth transistor are both electrically connected to a gate electrode of the sixth transistor, and a first electrode of the fifth transistor is electrically connected to the second level signal input terminal;

a first electrode of the sixth transistor is electrically connected to the second level signal input terminal, and a second electrode of the sixth transistor is electrically connected to an output terminal of an inverter to which the sixth transistor belongs.

4. The voltage-controlled oscillator according to claim 1, wherein the second inverter and/or the third inverter comprises a fifth control unit, a sixth control unit, a seventh control unit, and an eighth control unit; the frequency control terminal comprises a first frequency control terminal and a second frequency control terminal, wherein the first frequency control terminal outputs a signal inverted with a signal outputted by the second frequency control terminal;

the fifth control unit is electrically connected to an input signal terminal, a first level signal input terminal, and an input terminal of the sixth control unit, respectively, and the fifth control unit is configured to, under control of the input signal terminal, turn on or turn off a connection between the first level signal input terminal and the input terminal of the sixth control unit;

the sixth control unit is also electrically connected to the second frequency control terminal and an output terminal of an inverter to which the sixth control unit belongs, respectively, and the sixth control unit is configured to, under control of the second frequency control terminal, turn on or turn off an electrical connection between an input terminal of the sixth control unit and the output terminal;

the seventh control unit is electrically connected to the first frequency control terminal, an output terminal of an inverter to which the seventh control unit belongs, and an output terminal of the eighth control unit, respectively, and the seventh control unit is configured to, under control of the first frequency control terminal, turn on or turn off a connection between the output terminal of the inverter to which the seventh control unit belongs and an output terminal of the eighth control unit;

the eighth control unit is also connected to the input signal terminal and the second level signal input terminal, respectively, and the eighth control unit is configured to, under control of the input signal terminal, turn on or turn off a connection between the second level signal input terminal and the output terminal of the eighth control unit;

the input signal terminal is a second input terminal or a third input terminal.

5. The voltage-controlled oscillator according to claim 4, wherein the fifth control unit comprises a seventh transistor, the sixth control unit comprises an eighth transistor, the seventh control unit comprises a ninth transistor, and the eighth control unit comprises a tenth transistor;

a gate electrode of the seventh transistor is electrically connected to the input signal terminal, a first electrode of the seventh transistor is electrically connected to the first level signal input terminal, and a second electrode of the seventh transistor is electrically connected to a first electrode of the eighth transistor;

a gate electrode of the eighth transistor is electrically connected to the second frequency control terminal, and a second electrode of the eighth transistor is electrically connected to an output terminal of an inverter to which the eighth transistor belongs;

a gate electrode of the ninth transistor is connected to the first frequency control terminal, a first electrode of the ninth transistor is connected to a second electrode of the tenth transistor, and a second electrode of the ninth transistor is electrically connected to an output terminal of an inverter to which the ninth transistor belongs;

a gate electrode of the tenth transistor is connected to the input signal terminal, and a first electrode of the tenth transistor is connected to the second level signal input terminal.

6. The voltage-controlled oscillator according to claim 1, wherein the delay unit of each stage further comprises: a fifth inverter and a sixth inverter;

an input terminal of the fifth inverter is electrically connected to a first output terminal of the delay unit to which the fifth inverter belongs, and an output terminal of the fifth inverter is electrically connected to a second output terminal of the delay unit to which the fifth inverter belongs;

an input terminal of the sixth inverter is electrically connected to a second output terminal of the delay unit to which the sixth inverter belongs, and an output terminal of the sixth inverter is electrically connected to a first output terminal of the delay unit to which the sixth inverter belongs.

7. A point-to-point (P2P) interface circuit, comprising the voltage-controlled oscillator according to claim 1.

8. An electronic device, comprising the P2P interface circuit according to claim 7.

9. A voltage-controlled oscillator control method, applied to the voltage-controlled oscillator according to claim 1, comprising:

controlling whether to activate the second inverter and the third inverter under control of the frequency control terminal;

the controlling whether to activate the second inverter and the third inverter under control of the frequency control terminal specifically comprises:

comparing, through the frequency comparison module, an input data frequency with a preset reference frequency, activating the second inverter and the third inverter when the input data frequency is greater than the preset reference frequency, and not activating the second inverter and the third inverter when the input data frequency is less than the preset reference frequency.

* * * * *